(12) United States Patent
Harrer et al.

(10) Patent No.: US 8,558,326 B2
(45) Date of Patent: Oct. 15, 2013

(54) SEMICONDUCTOR DEVICES HAVING NANOCHANNELS CONFINED BY NANOMETER-SPACED ELECTRODES

(75) Inventors: Stefan Harrer, New York, NY (US); Stanislav Polonsky, Putnam Valley, NY (US); Mark B. Ketchen, Hadley, MA (US); John A. Ott, Greenwood Lake, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/430,906

(22) Filed: Mar. 27, 2012

(65) Prior Publication Data
US 2012/0256281 A1    Oct. 11, 2012

Related U.S. Application Data

(60) Provisional application No. 61/472,349, filed on Apr. 6, 2011.

(51) Int. Cl.
*H01L 27/14* (2006.01)
(52) U.S. Cl.
USPC .............. 257/414; 438/48; 324/71.5; 435/6.1
(58) Field of Classification Search
USPC .............. 257/252, 253, 414; 438/49, 435, 48; 324/71.1; 435/6.1
See application file for complete search history.

(56) References Cited

U.S. PATENT DOCUMENTS

| | | | |
|---|---|---|---|
| 7,001,792 B2 | 2/2006 | Sauer et al. | |
| 7,468,271 B2 | 12/2008 | Golovchenko et al. | |
| 7,553,730 B2 | 6/2009 | Barth et al. | |
| 7,678,562 B2 | 3/2010 | Ling | |
| 2006/0237805 A1* | 10/2006 | Segal et al. | 257/414 |
| 2008/0187915 A1* | 8/2008 | Polonsky et al. | 435/6 |
| 2009/0136958 A1 | 5/2009 | Gershow et al. | |
| 2010/0055699 A1 | 3/2010 | Kathya | |
| 2010/0066348 A1* | 3/2010 | Merz et al. | 324/71.1 |
| 2011/0227558 A1* | 9/2011 | Mannion et al. | 324/71.1 |

OTHER PUBLICATIONS

D.J. Bonthuis et al., "Conformation and Dynamics of DNA Confined in Slitlike Nanofluidic Channels," The American Physical Society, Physical Review Letters, Sep. 2008, pp. 108303-1-108303-4, vol. 101, No. 10.

(Continued)

*Primary Examiner* — Matthew W Such
*Assistant Examiner* — Stephen Bradley
(74) *Attorney, Agent, or Firm* — Vazken Alexanian; Ryan, Mason & Lewis, LLP

(57) ABSTRACT

Semiconductor devices having integrated nanochannels confined by nanometer spaced electrodes, and VLSI (very large scale integration) planar fabrication methods for making the devices. A semiconductor device includes a bulk substrate and a first metal layer formed on the bulk substrate, wherein the first metal layer comprises a first electrode. A nanochannel is formed over the first metal layer, and extends in a longitudinal direction in parallel with a plane of the bulk substrate. A second metal layer is formed over the nanochannel, wherein the second metal layer comprises a second electrode. A top wall of the nanochannel is defined at least in part by a surface of the second electrode and a bottom wall of the nanochannel is defined by a surface of the first electrode.

19 Claims, 10 Drawing Sheets

(56) References Cited

OTHER PUBLICATIONS

Z. Chen et al., "Mechanisms for Formation of a One-Dimensional Horizontal Anodic Aluminum Oxide Nanopore Array on a Si Substrate," Journal of The Electrochemical Society, Oct. 2005, pp. D227-D231, vol. 152, No. 12.

H. Im et al., "A Dielectric-Modulated Field-Effect Transistor for Biosensing," Nature Publishing Group, Nature Nanotechnology, Jul. 2007, pp. 430-434, vol. 2, No. 7.

J.J. Kasianowicz et al., "Characterization of Individual Polynucleotide Molecules Using a Membrane Channel," Procedures of the National Academy of Sciences, Nov. 1996, pp. 13770-13773, vol. 93, No. 24.

M.J. Kim et al., "Rapid Fabrication of Uniformly Sized Nanopores and Nanopore Arrays for Parallel DNA Analysis," Advanced Materials, Dec. 2006, pp. 3149-3153, vol. 18, No. 23.

\* cited by examiner

SEMICONDUCTOR DEVICES HAVING NANOCHANNELS CONFINED BY NANOMETER-SPACED ELECTRODES

CROSS-REFERENCE TO RELATED APPLICATION

This application claims priority to U.S. Provisional Pat. Application Ser. No. 61/472,349, filed on Apr. 6, 2011, the disclosure of which is fully incorporated herein by reference.

TECHNICAL FIELD

This invention relates generally to semiconductor devices having integrated nanochannels confined by nanometer spaced electrodes, and VLSI (very large scale integration) planar fabrication methods for constructing semiconductor devices having integrated nanochannels confined by nanometer spaced electrodes.

BACKGROUND

Recently, there has been growing interest in utilizing nanopores/nanochannels as sensors for rapid analysis of biomolecules such as DNA, RNA, protein, etc. Special emphasis has been given to applications of nanopores/nanochannels for DNA sequencing, as this technology will enable reductions in the cost of sequencing below $1000/human genome. A key issue with these techniques is to fabricate nanopores/nanochannels and to integrate electrodes within the nanopore build while enabling electric measurements inside the nanopores/nanochannels. Due to the sub-10 nm cross-section dimensions of these nanopores/nanochannels which is needed for, e.g., DNA sequencing applications, unconventional, time-consuming and, thus, extremely expensive nanofabrication techniques are commonly employed for state-of-the-art nanopore/nanochannel fabrication. These techniques typically employ transmission electron microscope for vertical pore drilling, self-assembly techniques, and electron-beam lithography.

SUMMARY OF THE INVENTION

Aspects of the invention include semiconductor devices having integrated nanochannels confined by nanometer spaced electrodes. The semiconductor devices are fabricated using planar, VLSI-based high yield integration techniques for fabricating fully integrated planar nanochannel structures comprising diameters in the sub-10 nm region and confined by nanometer-spaced and easily addressable electrodes.

In one aspect of the invention, a semiconductor device includes a bulk substrate and a first metal layer formed on the bulk substrate, wherein the first metal layer comprises a first electrode. A nanochannel is formed over the first metal layer, and extends in a longitudinal direction in parallel with a plane of the bulk substrate. The nanochannel has a cross-section defined by a width d and height h. A second metal layer is formed over the nanochannel, wherein the second metal layer comprises a second electrode. A top wall of the nanochannel is defined at least in part by a surface of the second electrode and a bottom wall of the nanochannel is defined by a surface of the first electrode. The surfaces of the first and second electrodes are spaced apart by h.

In another aspect of the invention, a method of foaming a semiconductor device includes depositing a first metal layer on a bulk substrate, the first metal layer comprising a first electrode; depositing a first dielectric layer on the first metal layer, the first dielectric layer having a thickness h; depositing a second dielectric layer on the first dielectric layer; forming a second metal layer on the second dielectric layer, the second metal layer comprising a second electrode having a width w, which extends through the second dielectric layer down to the first dielectric layer; etching the first dielectric layer selective to the first metal layer, the second metal layer and the second dielectric layer, to form an undercut structure at a lateral depth d into a side surface of the first dielectric layer; and anisotropically depositing a third dielectric layer to enclose the undercut structure in the first dielectric layer to form a nanochannel that longitudinally extends in a direction parallel to a plane of the bulk substrate, wherein a top wall of the nanochannel is defined at least in part by a surface of the second electrode and a bottom surface of the second dielectric layer, wherein a bottom wall of the nanochannel is defined by a surface of the first electrode, wherein a first side wall of the nanochannel is defined at least in part by a side surface of the first dielectric layer, wherein a second side wall of the nanochannel is defined at least in part by a surface of the third dielectric layer, and wherein the nanochannel has a cross-sectional area of $h \times d$.

These and other aspects, features and advantages of the present invention will become apparent from the following detailed description of preferred embodiments, which is to be read in conjunction with the accompanying figures.

BRIEF DESCRIPTION OF THE DRAWINGS

FIGS. 2A, 2B, 2C, 2D, 2E, 2F, 2G and 2H schematically illustrate a method for constructing a semiconductor device having an integrated nanochannel confined by nanometer spaced electrodes at various stages of fabrication, according to an exemplary embodiment of the invention, wherein:

FIG. 2A is a cross-sectional view of a semiconductor device at an initial stage of fabrication comprising a multilayer stack including a substrate, a first metal layer, a first dielectric layer, and a second dielectric layer, FIG. 2B is a cross-sectional view of the structure of FIG. 2A after etching the second dielectric layer, FIG. 2C is a cross-sectional view of the structure of FIG. 2B after forming a third dielectric layer, FIG. 2D is a cross sectional view of the structure of FIG. 2C after forming a second electrode structure with a thin detector electrode, FIG. 2E is a cross-sectional view of the structure taken along line 2E-2E in FIG. 2D, FIG. 2F is a cross-sectional view of the structure of FIG. 2E after forming a trench, FIG. 2G is a cross-sectional view of the structure of FIG. 2F after forming undercut structures in the first dielectric layer, and FIG. 2H is a cross-sectional view of the structure of FIG. 2G after depositing a fourth dielectric layer to form enclosed nanochannels.

FIGS. 4A, 4B, 4C, 4D, 4E, 4F, and 4G schematically illustrate a method for constructing a semiconductor device having an integrated nanochannel confined by nanometer spaced electrodes at various stages of fabrication, according to another exemplary embodiment of the invention, wherein:

FIG. 4A is a cross-sectional view of a semiconductor device at an initial stage of fabrication after forming a conformal second metal layer over the structure of FIG. 2B, FIG. 4B is a cross-sectional view of the structure of FIG. 4A after etching the conformal second metal layer to form a thin detector electrode, FIG. 4C is a cross-sectional view of the structure of FIG. 4B after forming an electrode pad that is in contact with the thin detector electrode, FIG. 4D is a cross-sectional view of the structure taken along line 4D-4D in FIG. 4C, FIG. 4E is a cross-sectional view of the structure of FIG. 4D after forming a trench, FIG. 4F is a cross-sectional view of the structure of FIG. 4E after forming undercut structures in the first dielectric layer, and FIG. 4G is a cross-sectional view of the structure of FIG. 4F after depositing a fourth dielectric layer to form enclosed nanochannels.

DETAILED DESCRIPTION OF THE PREFERRED EMBODIMENTS

Preferred embodiments of the invention will now be described in further detail with reference to semiconductor devices having integrated nanochannels confined by nanometer spaced electrodes, and VLSI (very large scale integration) planar fabrication methods for constructing semiconductor devices having integrated nanochannels confined by nanometer spaced electrodes. It is to be understood that the invention is not limited to the particular materials, features, and processing steps shown and described herein. Modifications to the illustrative embodiments will become apparent to those of ordinary skill in the art. It should also be understood that the various layers and/or regions shown in the accompanying figures are not drawn to scale, and that one or more semiconductor layers and/or regions of a type commonly used in such integrated circuits may not be explicitly shown in a given figure for ease of explanation. Particularly with respect to processing steps, it is to be emphasized that the descriptions provided herein are not intended to encompass all of the processing steps that may be required to form a functional integrated semiconductor device. Rather, certain processing steps that are commonly used in forming semiconductor devices, such as, for example, wet cleaning and annealing steps, are purposefully not described herein for economy of description. However, one of ordinary skill in the art will readily recognize those processing steps omitted from these generalized descriptions.

Figure 1:
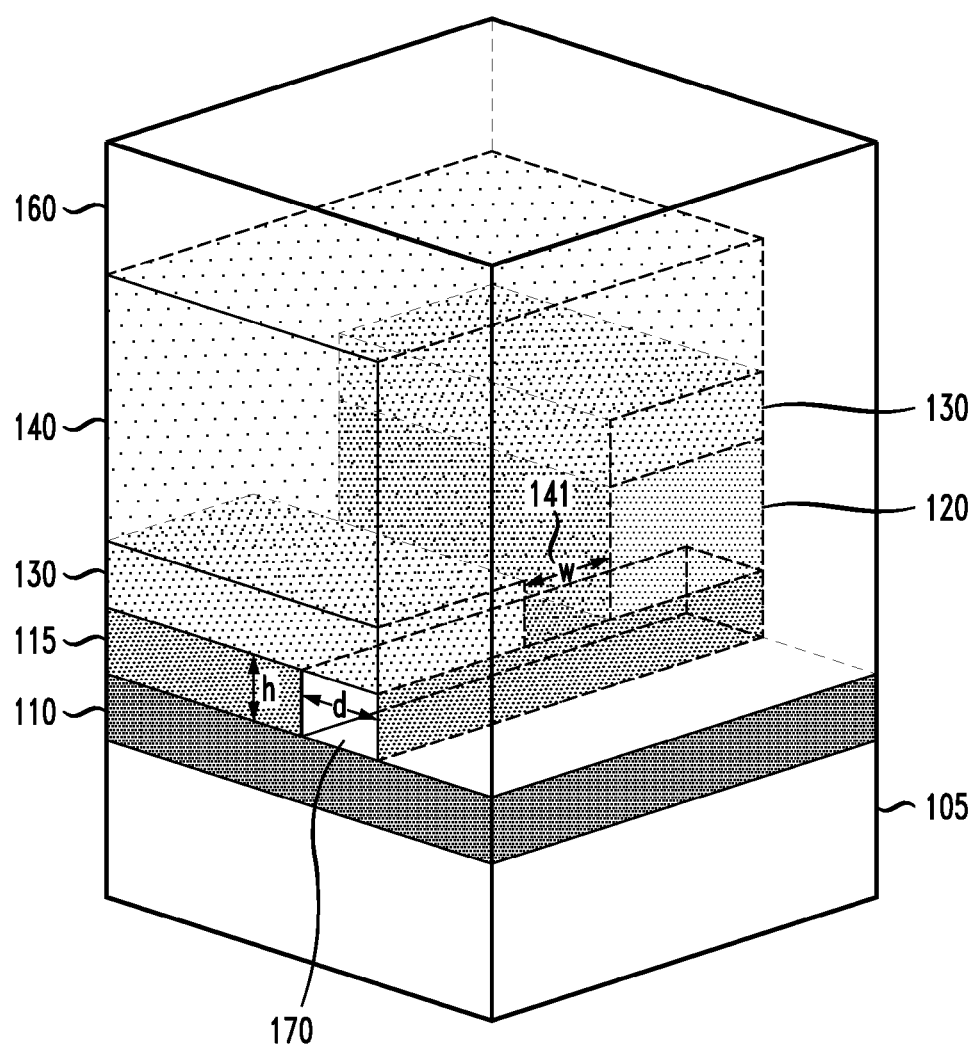
FIG. 1 is a 3-D perspective view of a semiconductor device having an integrated nanochannel confined by nanometer spaced electrodes, according to an exemplary embodiment of the invention.

FIG. 1 is a 3-D perspective view of a semiconductor device 100 having an integrated nanochannel confined by nanometer spaced electrodes, according to an exemplary embodiment of the invention. In general, the semiconductor device 100 includes a bulk substrate 105, a first metal layer 110, a first dielectric layer 115, a second dielectric layer 120, a third dielectric layer 130, a second metal layer 140 comprising a thin detector electrode 141, a fourth dielectric layer 160 and a planar nanochannel 170. The first metal layer 110 comprises a first (bottom) electrode and the second metal layer 140 comprises a second (top) electrode. The planar nanochannel separates the thin detector electrode feature 141 of the upper electrode 140 from the lower electrode 110.

The nanochannel 170 is depicted as having a rectangular cross-section h×d, where for purposes of this disclosure, the parameter h refers to the height of the nanochannel 170 and the parameter d refers to the width of the nanochannel 170. As discussed in further detail below, standard VLSI fabrication techniques can be employed to construct a semiconductor device 100 as depicted in FIG. 1 having a planar build framework, in which both the dimensions h and d of the nanochannel can be formed with sizes in a range of about 1-10, while the nanochannel longitudinally extends in microns of length parallel to the plane of the bulk substrate 105. The nanochannel 170 is deemed "planar" because the longitudinal direction of the nanochannel extends in a direction that is parallel to the plane of the bulk substrate 105.

As depicted in FIG. 1, the planar nanochannel 170 has each of its inner walls (e.g., top, bottom and two sidewalls) defined by different material layers. In particular, a bottom wall of the nanochannel 170 is defined by an upper surface of the first metal layer 110. One sidewall of the nanochannel 170 is defined by a side surface of the first dielectric layer 115, and the other sidewall of the nanochannel 170 is defined by a side surface of the fourth dielectric layer 160. Moreover, a top wall of the nanochannel 170 is defined, in part, by a bottom surface of the third dielectric layer 130, and in part by a bottom surface of the second dielectric layer 120, and in part by a bottom surface of the thin detector electrode 141.

Moreover, with regard to the dimensions of the electrodes, the width w of the thin detector electrode 141 is a parameter that can be strictly controlled using VLSI fabrication techniques (as will be described below) to achieve a detector electrode width, w, within a range of about 1-10 nm. As shown in FIG. 1, the thin detector electrode 141 portion of the second electrode layer 140 (upper electrode) interfaces with the planar nanochannel 170 with an area of d×w at the interface level between the first dielectric layer 115 and the second dielectric layer 120. Furthermore, the first metal layer 110 (the lower electrode) interfaces with the nanochannel 170 with an area of d×(length of nanochannel) at the interface between the first metal layer 110 and the first dielectric layer 115. The first and second electrodes are separated by the height h of the nanochannel 170, which can have a sub-10 nm dimension, or more preferably, a sub-5 nm dimension.

The semiconductor device 100 of FIG. 1 can be used for many applications. In the exemplary embodiment, the enclosed nanochannel 170 is a nanopore that separates the bottom electrode layer from the upper electrode layer. In some applications, voltage can be applied to the upper and lower electrodes, or voltage or charges can be detected using the upper and lower electrodes in circumstances where the semiconductor device 100 is operated as a chemical sensor, or a biological sensor, or used to perform DNA sequencing. In particular, the nanochannel 170 can be filled with a solution that contains some material (or arbitrary species) to be detected, such as a chemical, an electrolyte, a polymer, a biomolecule, DNA etc. After filling the nanochannel with a solution containing an arbitrary species, the portion of the solution that flows between the upper electrode 141 and the bottom electrode 110 controls the current through the nanochannel. The device 100 can be operated in two ways.

In one mode of operation, the device 100 can be a nanopore-controlled FET. With this mode of operation, current flow through the nanochannel between the upper and lower electrodes is controlled by the voltage that is applied to the electrodes and by that portion of the solution that is between top electrode and bottom electrode. In another mode of operation, the device 100 can be a chemical/biochemical sensor, whereby species in the solution can be detected through a current "fingerprint" that the species will trigger when moving through the nanochannel between the upper electrode and lower electrode.

The sensor application is extremely useful for electrical-sensing nanopore based DNA-sequencing purposes, since specific nucleotides correspond to specific tunneling currents through these nucleotides, hence measuring the individual tunneling current through a specific nucleotide that passes through between the bottom electrode and the top electrode allows for determining the type of nucleotide that passes through. In this regard, it is advantageous to make the width w of the detector electrode 141 be as thin as possible to resolve the smallest separation of charges in the given molecule that is to be detected. For instance, with DNA sequencing, the separation of charges between two neighboring bases in a DNA molecule is approximately 7 angstroms. In this regard, a thin detector electrode 141 having a width on the order of 2 nm would be advantageous for this detection scheme.

Figure 2A:
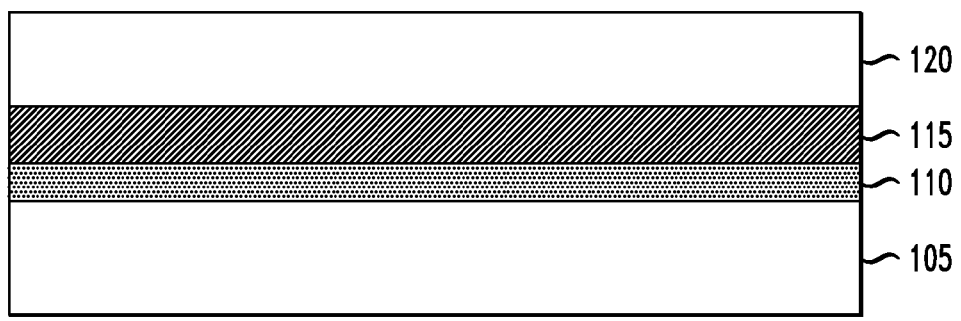

FIGS. 2A, 2B, 2C, 2D, 2E, 2F, 2G and 2H schematically illustrate a method for constructing a semiconductor device having an integrated nanochannel confined by nanometer spaced electrodes, according to an exemplary embodiment of the invention. In particular, FIGS. 2A, 2B, 2C, 2D, 2E, 2F, 2G and 2H are cross-sectional views of a portion of the semiconductor device 100 of FIG. 1 at various stages of fabrication. FIG. 2A is a cross-sectional view of a semiconductor device at an initial stage of fabrication comprising a multilayer stack comprising a substrate 105, a first metal layer 110 formed over the substrate 105, a first dielectric layer 115 formed over the first metal layer 110, and a second dielectric layer 120 formed over the first dielectric layer 115.

The substrate 105 can be a silicon substrate, an SIO (silicon on insulator) substrate, or the substrate can be formed with any other type of substrate material, or multiple layers of substrate materials, commonly used in VLSI fabrication methods. The first metal layer 110, which serves as a first electrode structure, can be formed using any metallic or conducting material such as polysilicon, gold, aluminum, titanium, titanium nitride, platinum, or any other standard metallization material used in VLSI fabrication techniques. The first and second dielectric layers 115 and 120 can be formed using various types of dielectric or insulating materials such as oxides and nitrides, which are commonly used in VLSI fabrication. As explained in further detail herein, the thickness of the first dielectric layer 115 formed over the first metal layer 110 is a parameter that defines a given dimension (e.g., height) of an integrated nanochannel that is subsequently formed. As further explained below, another dimension (e.g., width) of an integrated nanochannel is formed in the first dielectric layer 115 by performing an etch process that is selective to the material forming, e.g., the second dielectric layer 120. In this regard, the first and second dielectric layers 115 and 120 are preferably formed with different dielectric/insulating materials that have etch selectivity with respect to each other.

Figure 2B:
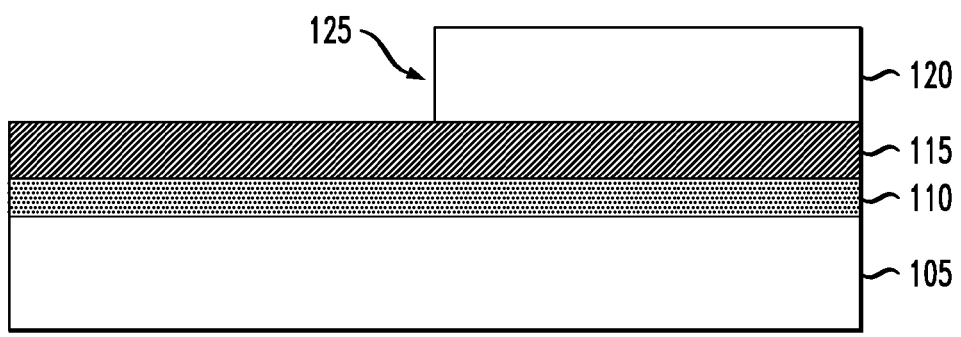

A next step in the exemplary fabrication process comprises patterning the second dielectric layer 120 to expose portions of the first dielectric layer 115. In particular, FIG. 2B is a cross sectional view of the structure of FIG. 2A after etching the second dielectric layer 120 to form a step structure 125. In one exemplary embodiment, the second dielectric layer 120 is patterned using a conventional optical lithography process and etching away portions of the dielectric layer 120 down to the first dielectric layer 115 to generate a step structure 125 where portions of the second dielectric layer 120 remain covering portions of the first dielectric layer 115. Any known etch process can be employed to etch the second dielectric layer 120 selective to the first dielectric layer 115, depending on the materials used to form the first and second dielectric layers 115 and 120.

Figure 2C:
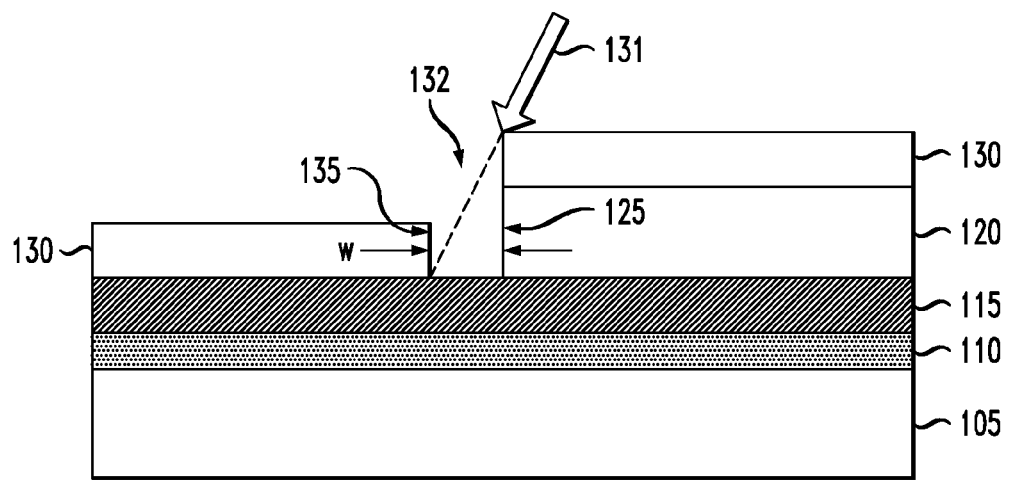

Next, referring to FIG. 2C, a third dielectric material is deposited over the resulting structure of FIG. 2B to form a third dielectric layer 130. The third dielectric layer 130 is formed using a process in which the dielectric material is deposited in a directed manner using a conventional shadow mask evaporation process 131 to cover the second dielectric layer 120, and to cover a portion of the first dielectric layer 115 while leaving a portion of the surface of the first dielectric layer 115 uncovered, which is adjacent to the step sidewall 125 of the second dielectric layer 120, thereby forming a trench 132. In this process, the material used to form the third dielectric layer 130 can be the same material that is used to form the second dielectric layer 120, while having etch selectivity to the material used to form the first dielectric layer 115.

With a conventional shadow mask evaporation process 131, the material forming the third dielectric layer 130 is deposited in a directed manner 131 so that the sidewall step 125 of the second dielectric layer 120 shields the portion of the first dielectric layer 115 adjacent the sidewall step 125 and prevents deposition of the dielectric material in that region thereby forming the trench 132. The sidewalls of the trench 132 are defined by the step sidewall 125 of the second dielectric layer 120 and a step sidewall 135 of a portion of the third dielectric layer 130 formed on the first dielectric layer 115. The width w of the trench 132 is a parameter that can be controlled based on the thickness of the second dielectric layer 120 and the angle of the shadow mask evaporation process 131. As discussed in further detail herein, the width w of the trench 132 defines a width of the thin detector electrode that is formed to be in contact with the nanochannel. With the exemplary fabrication process, a width w of sub-10 nm, preferably sub-5 nm, can be readily achieved.

Figure 2D:
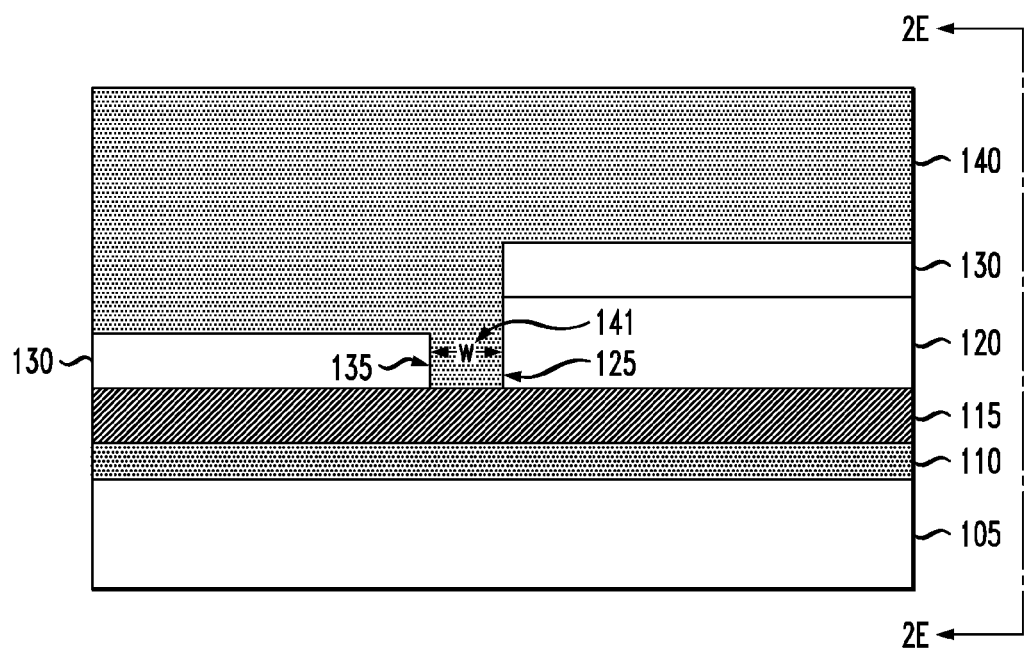

After forming the trench 132, a metallic or conductive material is deposited over the stack structure of FIG. 2C to fill the trench 132 and form a second electrode layer. For example, FIG. 2D is a cross sectional schematic view of the stack structure of FIG. 2C after forming a second (upper) electrode structure 140 with a thin detector electrode 141 formed by filling the trench 132 with metallic conducive material. In one exemplary embodiment, the electrode structures 140 and 141 are formed using a damascene step in which a metallic material is deposited to fill the trench 132 and continue the fill process to completely cover the surface of the third dielectric layer 130 with metallic material. In FIG. 2D, the thin detector electrode 141 extends in a longitudinal direction perpendicular to the plane of the drawing sheet. Next, a CMP (chemical mechanical polish) process is performed to polish and planarize the deposited metallic material to form the second (upper) electrode 140 with a planar surface, resulting in the structure depicted in FIG. 2D.

Figure 2E:
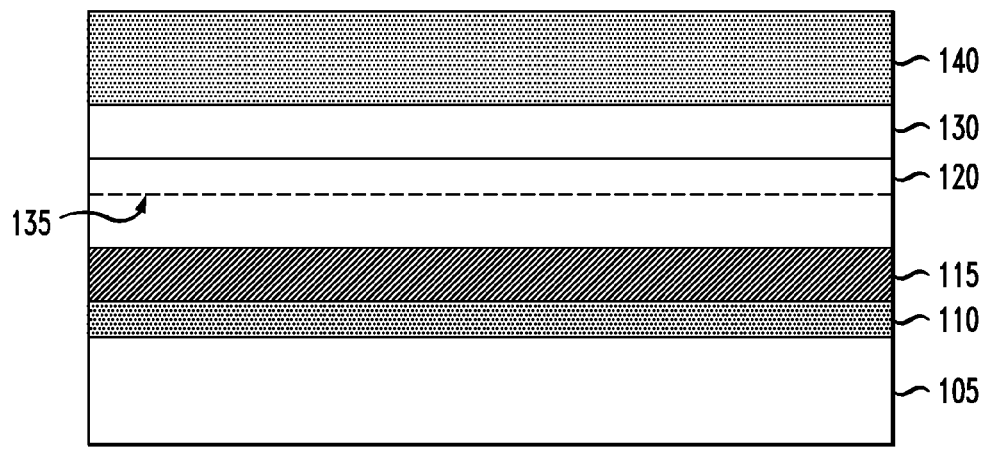

FIGS. 2E, 2F, 2G and 2H schematically illustrate a next sequence of steps in the exemplary fabrication process for forming a trench in the stack structure of FIG. 2D down to the first metal layer 110 and forming nanochannel structures, resulting in the exemplary semiconductor device depicted in FIG. 1. FIG. 2E is a cross-sectional view of the stack structure taken along line 2E-2E in FIG. 2D. In FIG. 2E, a dotted line is included to illustrate, in phantom, the sidewall 135 of the third dielectric layer 130 formed on the first dielectric layer 115. In FIG. 2E, the thin detector electrode 141 (not specifically shown) extends in a longitudinal direction along the direction of the sidewall 135 of the third dielectric layer 130. Starting with the exemplary stack structure depicted in FIG. 2E, a trench 150 is formed through the various layers 140, 130, 120 and 115 down to the first metal layer 110, thereby forming the structure depicted in FIG. 2F.

Figure 2F:
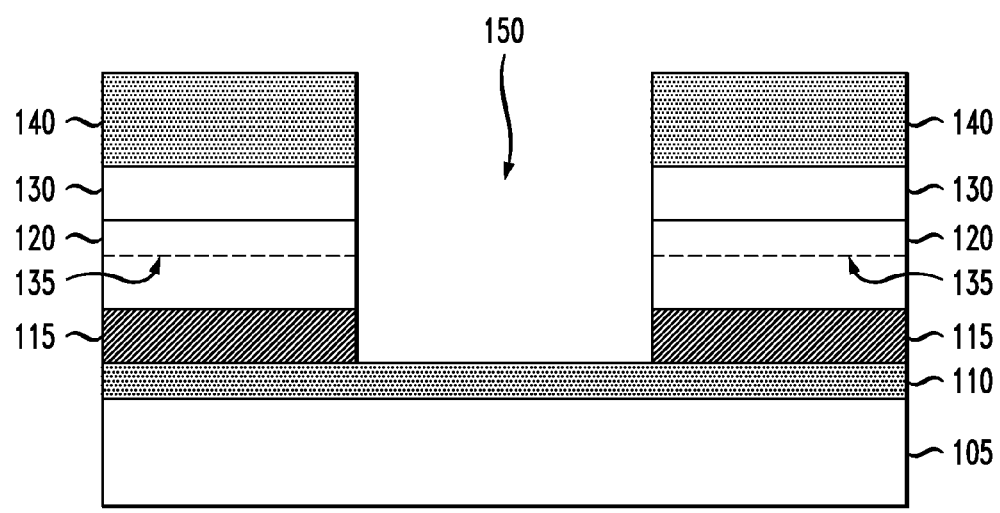

In FIG. 2F, the trench 150 is formed to extend in a longitudinal direction that is perpendicular to the longitudinal direction in which the thin detector electrode 141 extends. The trench 150 may be formed using a conventional photolithography process to form a photolithographic mask, followed by a sequence of one or more anisotropic etch processes that are suitable for etching the various materials forming layers 140, 130, 120 and 115 using the photolithographic mask.

Figure 2G:
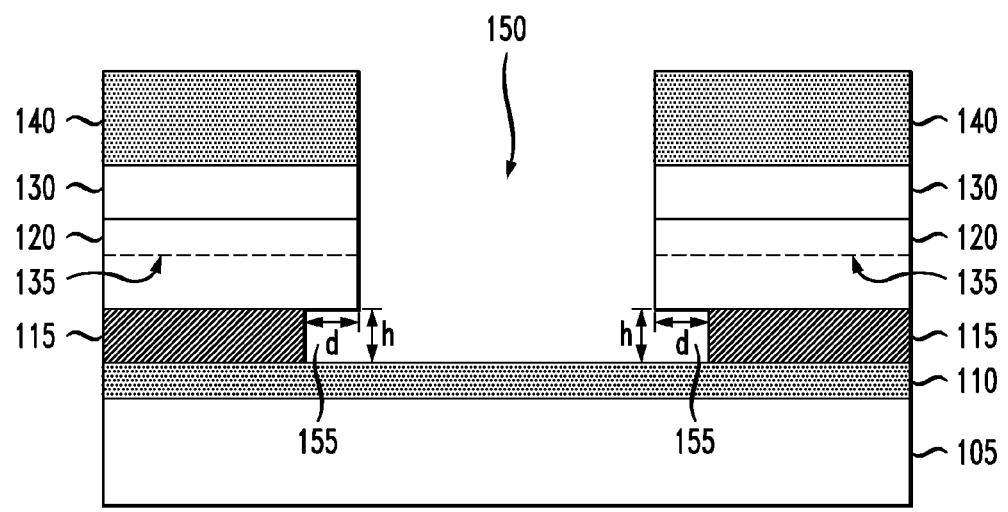

Next, referring to FIG. 2G, an under etch process is performed to laterally etch the side wall surface regions of the first dielectric layer 115 that are exposed within trench 150 to form undercut structures 155 (or voids) in the first dielectric layer 115. In one exemplary embodiment, the exposed sidewall surfaces of the first dielectric layer 115 are selectively wet etched with respect to all other exposed layers 140, 130, 120, and 110 to form the undercut structures 155 without etching away exposed portions of layers 140, 130, 120, and 110. As depicted in FIG. 2G, the undercut structures 155 are formed to protrude underneath the second dielectric layer 120 by a depth d, which depth is determined by the length of the selective wet etch. The undercut structures 155 extend in a longitudinal direction along the length of the trench 150 and are formed perpendicular to the longitudinal direction of the thin detector electrode 141. The undercut structures 155 extend below end portions of the thin detector electrodes 141 at both sides of the trench 150.

Figure 2H:
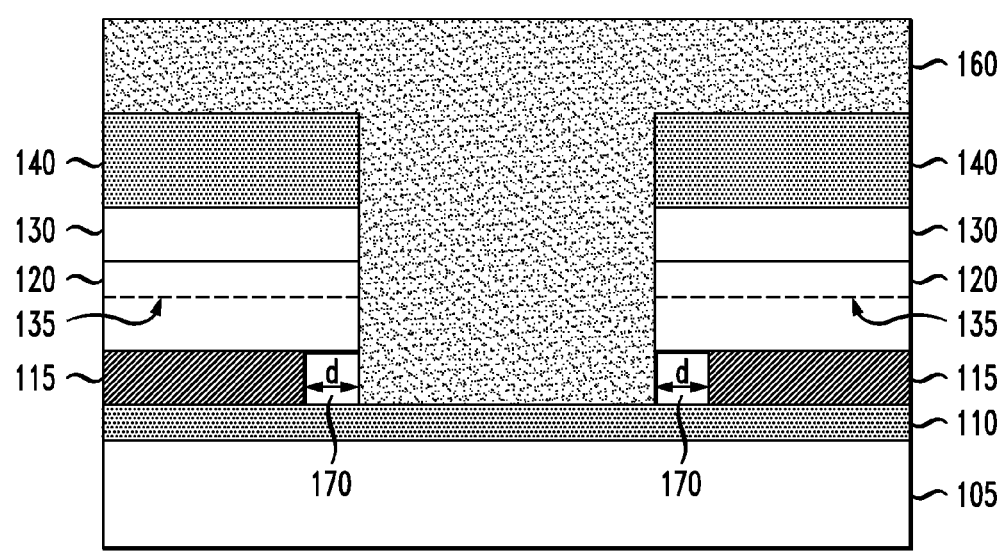

After forming the undercut structures 155, a dielectric material is deposited over the structure of FIG. 2G to fill the trench the trench 150 and form a fourth dielectric layer 160, as depicted in FIG. 2H. In one exemplary embodiment, the trench 150 is filled with a dielectric material using an anisotropic damascene process that vertically fills the trench 150 with dielectric material, while leaving the undercut structures 155 unfilled, thereby forming enclosed nanochannel structures 170 at the bottom of the filled trench 150. This dielectric fill process continues to completely cover the second metallic layer 140.

In FIG. 2H, the nanochannels 170 form two enclosed channels with a cross-dimensional area of d×h. The nanochannels 170 longitudinally extend in a direction perpendicular to the thin detector electrode 141 that is formed as part of the second metal layer 140, which forms a second electrode. The first metal layer 110 forms a first (lower) electrode that is separated from the thin detector electrode 141 by the height, h, of the enclosed channels.

The fabrication techniques described herein allow tight control of the dimensions of the nanochannels 170, without the need for complex, expensive processing methodologies. For instance, the height h of the nanochannel 170 is exclusively controlled by the thickness of the first dielectric layer 115. The thickness of the first dielectric layer 115 can be controlled with nanometer precision within 1-10 nm, preferably 3-5 nm, using various deposition techniques. For example, ultra-low thickness deposition techniques that may be implemented include, but are not limited, to molecular beam epitaxy (MBE), low pressure chemical vapor deposition (LPCVD), and atomic layer deposition (ALD), as well as other known deposition methods that allow the dielectric layer 115 to be grown crystal layer by crystal layer. These deposition methods allow strict control of the thickness of the dielectric layer 115 over the entire deposition area, which allows formation of nanochannels with consistent height h (e.g., 3 nm) over micrometer lengths of the nanochannels 170.

Furthermore, the width d of the nanochannel 170 can be well controlled with nanometer precision by the length of the selective wet etch that is employed to etch the first dielectric layer 115 to form the undercut structures 155, as discussed above with reference to FIG. 2G. For example, minimum depths d that can be achieved are about 10 nm or 5 nm. Therefore, the cross-sectional dimensions of the enclosed nanochannels 170 can be controlled with nanometer precision down to 10 nm in width d, and down to 1-5 nm in height h. While the enclosed nanochannels 170 comprise nanometer dimensions in cross-section dimensions (d×h), the nanochannels 170 longitudinally macroscopically. The first and second electrodes are separated by the height h of the nanochannels, e.g., 1-5 nm.

Moreover, with regard to the dimensions of the electrodes, as discussed above with reference to FIGS. 2C and 2D, the width w of the first trench 132 is determined by the thickness of the residual dielectric layer 120 and the angle of the shadow mask evaporation process. Both of these parameters can be adjusted to achieve a width w within a range of about 1-10 nm. In this regard, the thin detector electrode 141 portion of the second electrode layer 140 interfaces with the with each nanochannel with an area of d×w at the interface level between the first dielectric layer 115 and the second dielectric layer 120. Furthermore, the first electrode layer 110 interfaces with each enclosed nanochannel with an area of d×(length of nanochannel) at the interface between the first metal layer 110 and the first dielectric layer 115. The first and second electrodes are separated by the height h of the nanochannels 170, e.g., 1-5 nm.

The various material layers 110, 115, 120, 130, and 140 are selected so that the first dielectric layer 115 can be etched selectively with respect to all other layers 110, 120, 130, and 140. Furthermore, the third dielectric layer 130 should have a thickness that is sufficient to shield the first dielectric layer 115 from electric fields that can penetrate into the first dielectric layer 115 when a voltage is applied to the second electrode layer 140. A minimum thickness of about 15 nm is preferred.

Figure 3:
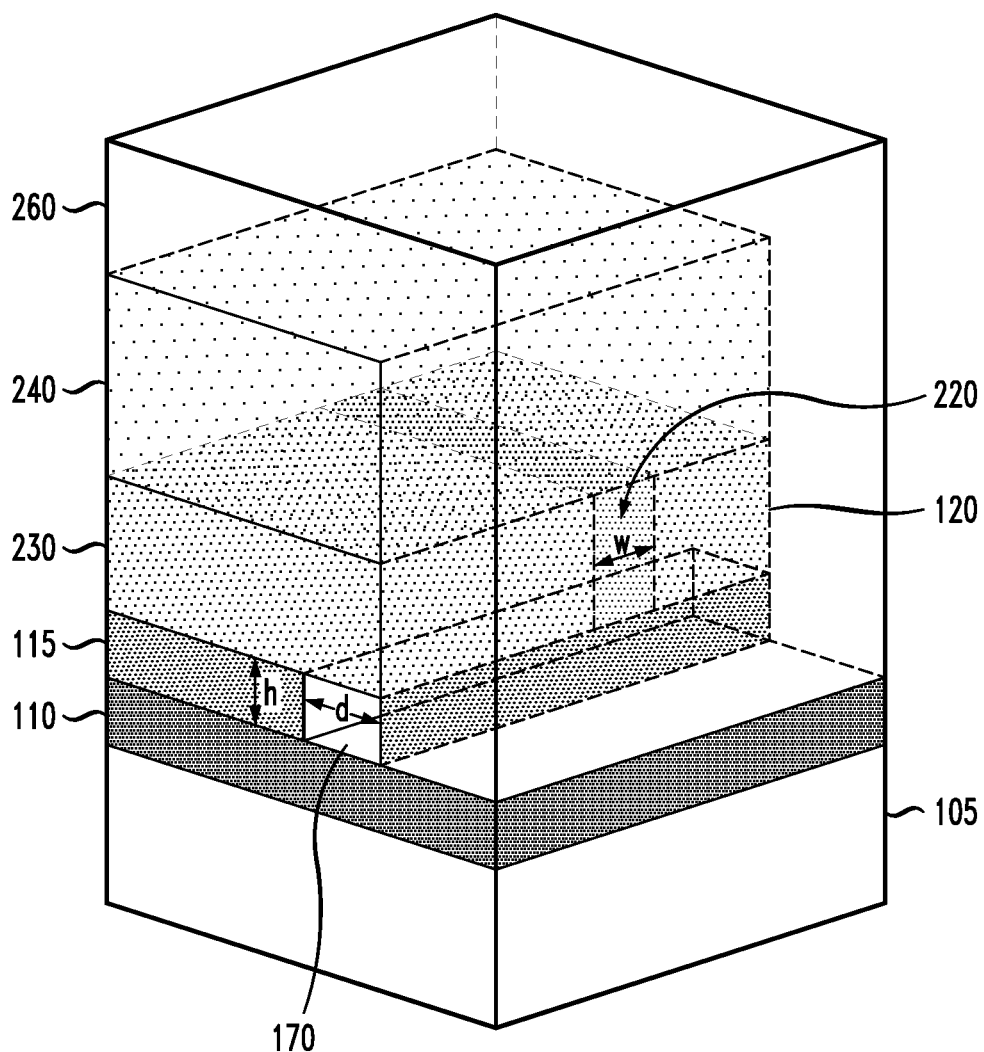
FIG. 3 is a 3-D perspective view of a semiconductor device having an integrated nanochannel confined by nanometer spaced electrodes, according to another exemplary embodiment of the invention.

FIG. 3 is a 3-D perspective view of a semiconductor device 200 having an integrated nanochannel confined by nanometer spaced electrodes, according to another exemplary embodiment of the invention. In general, the semiconductor device 200 includes a bulk substrate 105, a first metal layer 110, a first dielectric layer 115, a second dielectric layer 120, a third dielectric layer 230, a second metal layer 220 comprising a thin detector electrode 220, a third metal layer 240, a fourth dielectric layer 260 and a planar nanochannel 170. The first metal layer 110 comprises a first (bottom) electrode and the second metal layer 220 and third metal layer 240 comprise a second (top) electrode. The planar nanochannel 170 separates the thin detector electrode feature 220 of the upper electrode 240 from the lower electrode 110.

The planar framework and modes of operation of the semiconductor device 200 of FIG. 3 are similar to that discussed above with regard to the semiconductor device 100 of FIG. 1, except for the formation of the upper electrode features 220 and 240. As discussed in further detail below with reference to FIGS. 4A-4G, standard VLSI fabrication techniques can be employed to construct the semiconductor device 200 as depicted in FIG. 3 having a planar build framework, in which both the dimensions h and d of the nanochannel 170 can be formed with sizes in a range of about 1-10 nm, and the width, w, of the thin detector electrode 220 can be formed within a range of about 1-10 nm.

Figure 4A:
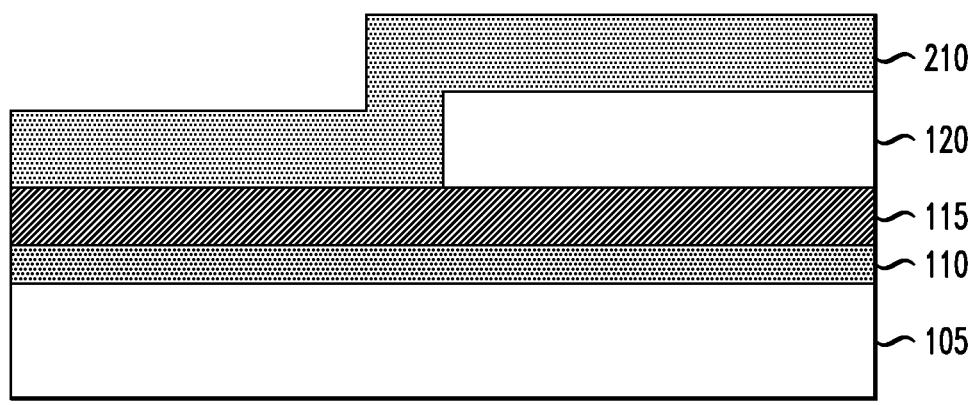

FIGS. 4A, 4B, 4C, 4D, 4E, 4F, and 4G schematically illustrate a method for constructing a semiconductor device having an integrated nanochannel confined by nanometer spaced electrodes, according to another exemplary embodiment of the invention. In particular, FIGS. 4A, 4B, 4C, 4D, 4E, 4F, and 4G are cross-sectional views of a portion of the semiconductor device 200 of FIG. 3 at various stages of fabrication. Referring initially to FIG. 4A, a schematic cross-section illustrates a multilayer stack comprising a substrate 105, a first metal layer 110 formed over the substrate 105, a first dielectric layer 115 formed over the first metal layer 110, and a second dielectric layer 120 formed over the first dielectric layer 115. FIG. 4A illustrates the exemplary structure of FIG. 2B, where the second dielectric layer 120 is patterned using a conventional optical lithography process and etching away portions of the dielectric layer 120 down to the first dielectric layer 115 to generate a step structure 125 where portions of the second dielectric layer 120 remain covering portions of the first dielectric layer 115.

As further depicted in FIG. 4A, a second metal layer 210 is conformally deposited over the structure of FIG. 2B, resulting in the structure shown in FIG. 4A. In this embodiment, the thickness of the second metal layer 210 is selected to achieve a given width w of the thin detector electrode 220, as depicted in FIG. 4B.

Figure 4B:
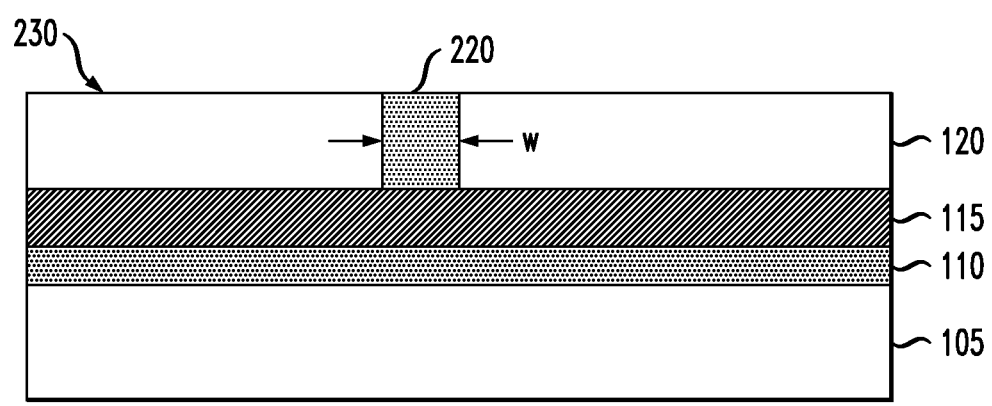

In particular, referring to FIG. 4B, the second metal layer 210 is anisotropically etched, to remove the portion of the second metal layer 210 on the horizontal surface of the first and second dielectric layers 120 and 115, while leaving residual metallic material 220 on the side surface of the sidewall step of the second dielectric layer 120. The residual metallic material 220 forms the thin detector electrode 220 have a desired width, w, in range of about 1 to 10 nm. Furthermore, after etching the second metal layer 210 to form the thin detector electrode 220, a third layer of dielectric material I 230 is blanket deposited, followed by a CMP process to remove portions of the dielectric material covering the detector electrode 220 and the second dielectric layer 120, and achieve a planar surface, such as depicted in FIG. 4B.

Figure 4C:
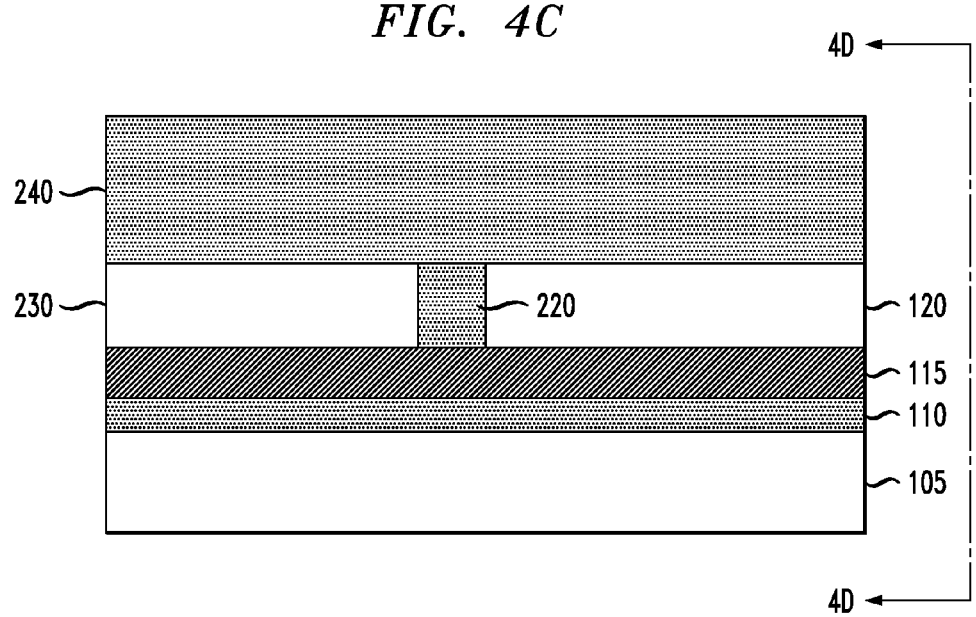

Referring to FIG. 4C, a next step in the exemplary fabrication process comprises depositing a third metal layer 240 over the structure of FIG. 4B to form a large contact pad 240 that is in contact with the thin detector electrode 220. The resulting structure of FIG. 4C is formed with an alternative process flow, which does not use a conventional shadow mask evaporation process 131 process, and metal deposition process, as discussed with reference to FIGS. 2C and 2D. In FIG. 4B, the desired width, w, of the thin electrode 220 is achieved by virtue of the thickness of the conformal metal layer 210 that is deposited and anisotropically etched (FIGS. 4A and 4B), as opposed to forming a trench 132 of width, w, and filing the trench 132 with metallic material 140 to form the thin detector electrode, as with the exemplary process flow of FIGS. 2C and 2D.

Figure 4D:
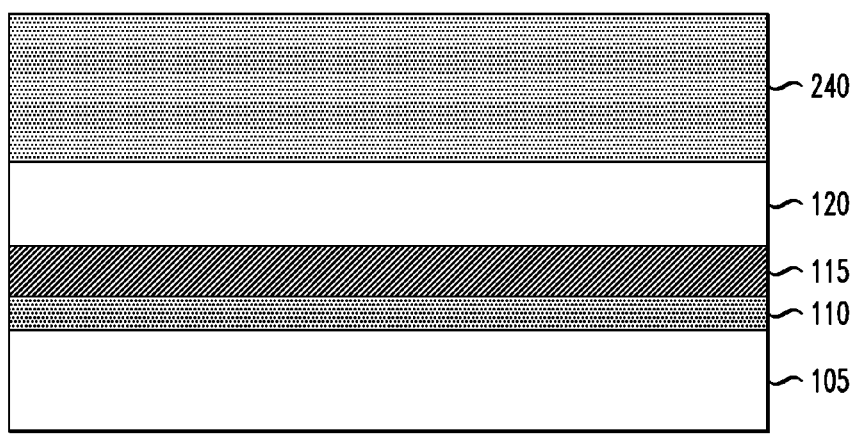

FIGS. 4D, 4E, 4F and 4G schematically illustrate a next sequence of steps in the exemplary fabrication process for forming a trench in the stack structure of FIG. 4C down to the first metal layer 110 and forming nanochannel structures, resulting in the exemplary semiconductor device depicted in FIG. 3. FIG. 4D is a cross-sectional view of the stack structure taken along line 4D-4D in FIG. 4C. Starting with the exemplary stack structure depicted in FIG. 4D, a trench 250 is formed through the various layers 240, 120 and 115 down to the first metal layer 110, thereby foaming the structure depicted in FIG. 4E.

Figure 4E:
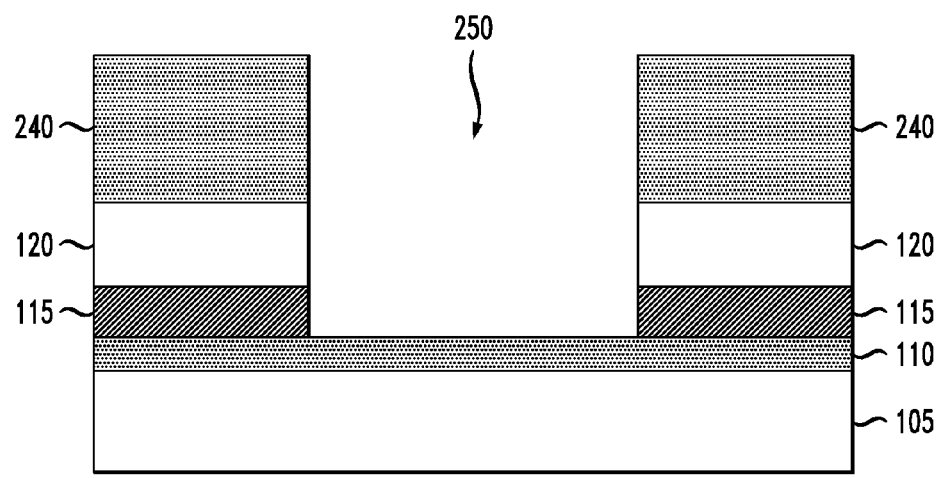

In FIG. 4E, the trench 250 is formed to extend in a longitudinal direction that is perpendicular to the longitudinal direction in which the thin detector electrode 220 extends. The trench 250 may be formed using a conventional photolithography process to form a photolithographic mask, followed by a sequence of one or more anisotropic etch processes that are suitable for etching the various materials forming layers 240, 120 and 115 using a photolithographic mask.

Figure 4F:
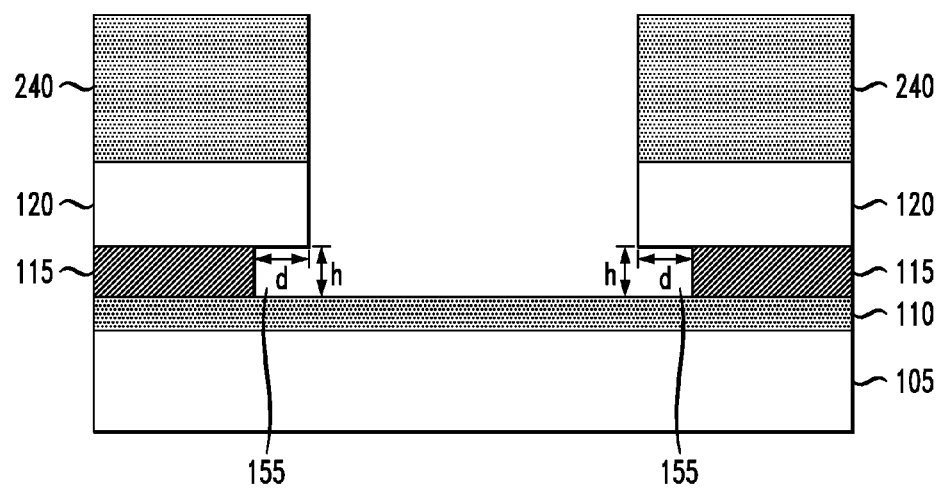

Next, referring to FIG. 4F, an under etch process is performed to laterally etch the side wall surface regions of the first dielectric layer 115 that are exposed within trench 250 to form undercut structures 155 (or voids) in the first dielectric layer 115. In one exemplary embodiment, the exposed sidewall surfaces of the first dielectric layer 115 are selectively wet etched with respect to all other exposed layers 240, 120, and 110 to form the undercut structures 155 without etching away exposed portions of layers 240, 120 and 110. As depicted in FIG. 4F, the undercut structures 155 are formed to protrude underneath the second dielectric layer 120 by a depth d, which is determined by the length of the selective wet etch. The undercut structures 155 extend in a longitudinal direction along the length of the trench 250 and are formed perpendicular to the longitudinal direction of the thin detector electrode 220. The undercut structures 155 extend below end portions of the tin detector electrode 220 at both sides of the trench 250.

Figure 4G:
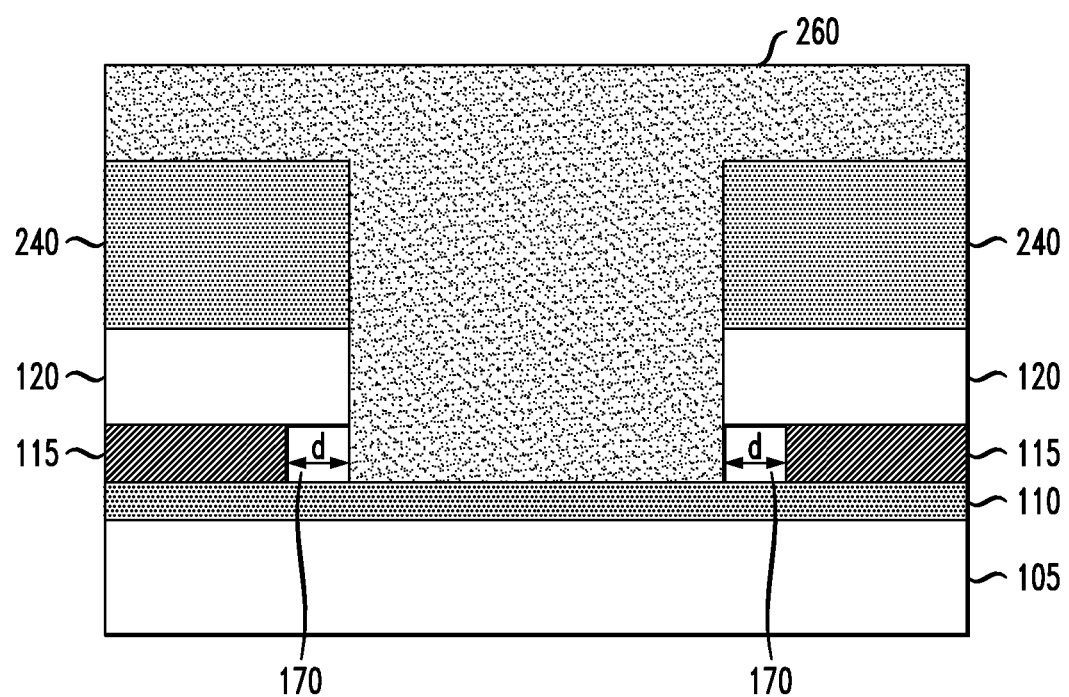

After forming the undercut structures 155, a dielectric material is deposited over the structure of FIG. 4F to fill the trench the trench 250 and form a fourth dielectric layer 260, as depicted in FIG. 4G. In one exemplary embodiment, the trench 250 is filled with a dielectric material using an anisotropic damascene process which vertically fills the trench 250 with dielectric material, while leaving the undercut structures 155 unfilled, thereby forming enclosed nanochannel structures 170 at the bottom of the filled trench 250. This dielectric fill process continues to completely cover the second metallic layer 240.

In FIG. 4G, the nanochannels 170 form two enclosed channels with a cross-dimensional area of d×h. The nanochannels 170 longitudinally extend in a direction perpendicular to the thin detector electrode 220 that is connected to the third metal layer 240, which forms a second upper electrode. The first metal layer 110 forms a first lower electrode that is separated from the upper electrode by the height, h, of the nanochannels 170.

Although exemplary embodiments of the present invention have been described herein with reference to the accompanying figures, it is to be understood that the invention is not limited to those precise embodiments, and that various other changes and modifications may be made therein by one skilled in the art without departing from the scope of the appended claims.

What is claimed is:

1. A semiconductor device, comprising:
   a bulk substrate;
   a first metal layer formed on the bulk substrate, the first metal layer comprising a first electrode;
   a nanochannel formed over the first metal layer, and extending in a longitudinal direction in parallel with a plane of the bulk substrate, the nanochannel having a cross-section defined by a width d and height h; and
   a second metal layer formed over the nanochannel, the second metal layer comprising a second electrode,
   wherein a top wall of the nanochannel is partially defined by a surface of the second electrode and wherein a bottom wall of the nanochannel is completely defined by a surface of the first electrode, wherein the surfaces of the first and second electrodes are spaced apart by h.

2. The semiconductor device of claim 1, wherein h is about 10 nm or less.

3. The semiconductor device of claim 1, wherein h is about 5 nm or less.

4. The semiconductor device of claim 1, wherein d is about 10 nm or less.

5. The semiconductor device of claim 1, wherein d is about 5 nm or less.

6. The semiconductor device of claim 1, wherein the second electrode longitudinally extends in a direction perpendicular to the longitudinal direction of the nanochannel.

7. The semiconductor device of claim 6, wherein the second electrode has a width w that is about 10 nm or less.

8. The semiconductor device of claim 6, wherein the second electrode has a width w that is about 5 nm or less.

9. The semiconductor device of claim 6, wherein a surface area of the second electrode which interfaces with the nanochannel is about 50 nm$^2$ or less.

10. The semiconductor device of claim 1, wherein the semiconductor device is a chemical sensor.

11. The semiconductor device of claim 1, wherein the semiconductor device is a biological sensor.

12. The semiconductor device of claim 1, wherein the semiconductor device is a DNA sequencing device.

13. A semiconductor device, comprising:
a bulk substrate;
a first metal layer formed on the bulk substrate, the first metal layer comprising a first electrode;
a nanochannel formed over the first metal layer, and extending in a longitudinal direction in parallel with a plane of the bulk substrate, the nanochannel having a cross-section defined by a width d and height h;
a second metal layer formed over the nanochannel, the second metal layer comprising a second electrode,
a first dielectric layer;
a second dielectric layer; and
a third dielectric layer;
wherein a first side wall of the nanochannel is defined at least in part by a surface of the first dielectric layer,
wherein a second side wall of the nanochannel is defined at least in part by a surface of the second dielectric layer;
wherein a top wall of the nanochannel is defined at least in part by a surface of the second electrode and at least in part by a surface of the third dielectric layer, and
wherein a bottom wall of the nanochannel is completely defined by a surface of the first electrode, wherein the surfaces of the first and second electrodes are spaced apart by h.

14. The semiconductor device of claim 13, wherein h is about 10 nm or less.

15. The semiconductor device of claim 13, wherein h is about 5 nm or less.

16. The semiconductor device of claim 13, wherein d is about 10 nm or less.

17. The semiconductor device of claim 13, wherein d is about 5 nm or less.

18. The semiconductor device of claim 13, wherein the second electrode has a width w that is about 10 nm or less.

19. The semiconductor device of claim 13, wherein a surface area of the second electrode which partially defines the top wall of the nanochannel is about 50 nm$^2$ or less.

* * * * *